United States Patent
Zhu et al.

(10) Patent No.: US 7,386,827 B1
(45) Date of Patent: Jun. 10, 2008

(54) BUILDING A SIMULATION ENVIRONMENT FOR A DESIGN BLOCK

(75) Inventors: Yong Zhu, Albuquerque, NM (US); Jorge Ernesto Carrillo, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 190 days.

(21) Appl. No.: 11/449,279

(22) Filed: Jun. 8, 2006

(51) Int. Cl.
*G06F 17/50* (2006.01)

(52) U.S. Cl. .......................................... 716/16; 716/17

(58) Field of Classification Search ................... 716/16, 716/17
See application file for complete search history.

(56) References Cited

U.S. PATENT DOCUMENTS

| | | | |
|---|---|---|---|
| 6,175,948 B1 * | 1/2001 | Miller et al. | 716/7 |
| 6,883,147 B1 * | 4/2005 | Ballagh et al. | 716/1 |
| 7,124,376 B2 * | 10/2006 | Zaidi et al. | 716/1 |
| 7,315,803 B1 * | 1/2008 | Carrillo et al. | 703/14 |
| 2002/0038401 A1 * | 3/2002 | Zaidi et al. | 710/305 |
| 2002/0040288 A1 * | 4/2002 | Yamoto et al. | 703/17 |

OTHER PUBLICATIONS

U.S. Appl. No. 11/055,275, filed Feb. 10, 2005, Carrillo et al.
U.S. Appl. No. 11/344,475, filed Jan. 31, 2006, Canaris et al.

* cited by examiner

*Primary Examiner*—Sun J Lin
(74) *Attorney, Agent, or Firm*—LeRoy D. Maunu; Lois D. Cartier (57) ABSTRACT

A method is provided for building a simulation environment. A first functional model is produced that emulates the interaction of a processor with a first interface of a bus for the processor as controlled by a first script. A second functional model is produced that is controllable to emulate multiple interfaces. The second functional model is controlled to emulate a second interface of an input/output peripheral by a second script. A third functional model is produced that emulates a memory subsystem. A simulation environment is automatically generated that simulates the design block for a programmable logic device. The simulation environment couples the bus to the design block and the first and third functional models, couples the second interface to the design block and the second functional model, and couples the first and second functional models via a synchronization bus used for synchronizing between transactions of the first and second scripts.

20 Claims, 8 Drawing Sheets

BUILDING A SIMULATION ENVIRONMENT FOR A DESIGN BLOCK

FIELD OF THE INVENTION

The present invention generally relates to simulation of a design block implemented in a programmable logic device.

BACKGROUND

The design of processor-based systems may include developing a design block that communicates with a processor via an interface bus of the processor. An example design block is a bridge between the protocol of the processor's interface bus and another communication protocol, such as Ethernet. The IBM Power PC processor is an example processor which is included in the Virtex-II Pro and Virtex-4 families of programmable logic devices (PLD) available from Xilinx, Inc. Another example processor is the Microblaze processor that may be implemented in the programmable logic and routing resources of a PLD. The IBM Power PC processor of Xilinx PLDs has the interface buses of IBM CoreConnect, including the Processor Local Bus, the On-Chip Peripheral Bus, and the Device Control Register bus. The Microblaze processor has the On-Chip Peripheral Bus for an interface bus.

The development of a design block for a processor-based system may include verification of the design block by way of simulating an example processor-based system. However, a simulation that includes simulating a processor may have a slow simulation speed due to the complexity of simulating the processor. In addition, the verification of a design block may require issuing particular transactions on the interface bus, and the processor may provide indirect control of the transactions issued on the interface bus, which may make the verification of a design block time-consuming and expensive. The verification of a design block may require issuing certain transactions on the interface bus that a specific normally functioning processor cannot issue, such as certain transactions with aborts, retries, and/or errors including bus parity errors.

A bus functional model may be a simplification of a processor that allows a direct specification of the transactions issued on the interface bus by the bus functional model. The bus functional model may also provide explicit control of exceptional conditions, such as aborts, retries, and errors. A simulation of a processor-based system using a bus functional model instead of a processor may provide an improvement in simulation speed. The bus functional model may also check every protocol rule of the interface bus and flag any violations of these protocol rules.

For a design block that is coupled to an interface bus of a processor and an input/output interface, a bus functional model could be used to control the interface bus, except that verification of the design block may require coordinated control and validation of both the interface bus and the input/output interface. For example, a defect in the design block may not cause improper operation on the processor's interface bus because the improper operation may only be evident on the input/output interface. Coordination of control and validation for a design block having a processor's interface bus and another bus may be time-consuming and expensive.

The present invention may address one or more of the above issues.

SUMMARY OF THE INVENTION

Various embodiments of the invention provide a method of building a simulation environment that includes a design block for a programmable logic device (PLD). A first functional model is produced that emulates the interaction of a processor with a first interface of a bus for the processor. The first functional model is controlled by a first script in a scripting language. The first script specifies transactions transferred between the first functional model and the first interface. A second functional model is produced that is controllable to emulate multiple interfaces. The second functional model is controlled to emulate a second interface of an input/output peripheral by a second script in the scripting language. The second script specifies transactions transferred between the second functional model and the second interface. A third functional model is produced that emulates a memory subsystem. The third functional model is responsive to a plurality of transactions of the bus for the processor.

The simulation environment is automatically generated that simulates the design block for the PLD. The simulation environment couples the bus for the processor to the design block and the first and third functional models, couples the second interface to the design block and the second functional model, and couples the first and second functional models via a synchronization bus used for synchronizing between the transactions of the first and second scripts.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
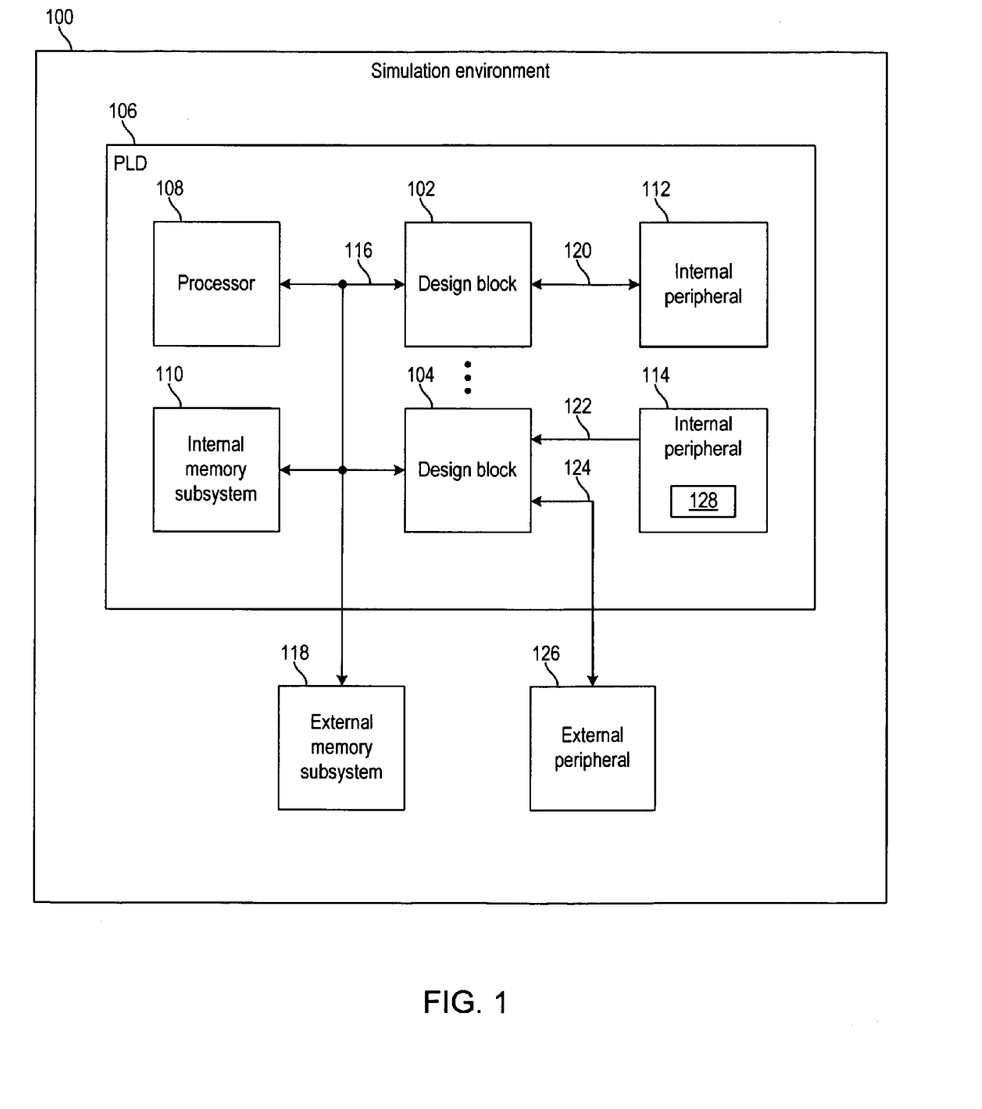
FIG. 1 is a block diagram of a simulation environment for design blocks of a programmable logic device in accordance with various embodiments of the invention.

FIG. 1 is a block diagram of a simulation environment 100 for design blocks 102 and 104 of a programmable logic device (PLD) 106 in accordance with various embodiments of the invention. The PLD 106 may implement a user design that includes the design blocks 102 and 104, a processor 108, an internal memory subsystem 110, and internal peripherals 112 and 114. The user design may be implemented in the PLD in dedicated circuits and/or programmable logic and interconnect resources of the PLD.

The processor 108 may have an interface bus on line 116, such an interface bus from IBM CoreConnect, which includes the Processor Local Bus, the On-Chip Peripheral Bus, and the Device Control Register bus. The simulation environment 100 may couple the interface bus on line 116 to the processor 108, the design blocks 102 and 104, the internal memory subsystem 110, and a memory subsystem 118 that is external to the PLD 106. During simulation, transactions of the interface bus on line 116 may transfer data between the processor 108, the design blocks 102 and 104, and the memory subsystems 110 and 118.

The design block 102 may permit data to be transferred between the processor interface bus on line 116 and an input/output peripheral interface on line 120. The processor interface bus on line 116 and the input/output interface on line 120 may have different protocols and the design block 102 may perform conversion between the protocols. Similarly, the design block 104 may convert between protocols for the processor interface bus on line 116 and the input/output interfaces on lines 122 and 124. Design block 102 may be coupled to peripheral 112 within PLD 106 by the input/output interface on line 120, and design block 104 may be coupled to internal peripheral 114 and external peripheral 126 by the respective input/output interfaces on lines 122 and 124. Examples for the input/output peripheral interfaces on lines 120, 122, and 124 include interfaces for Ethernet, Universal Serial Bus, RS232 serial bus, Peripheral Component Interconnect, generic purpose 10, and local link interface bus.

Various embodiments of the invention provide efficient simulation of the design blocks 102 and 104. The simulation environment 100 could include detailed simulation models for the processor 108, the design blocks 102 and 104, the memory subsystems 110 and 118, and the peripherals 112, 114, and 126; however, usage of detailed simulation models for all of the blocks of simulation environment 100 may lead to slow simulation speed due to the overall complexity of simulating these blocks, especially the complexity of simulating the processor 108. A simulation environment for verifying the design blocks 102 and 104 may use detailed simulation models for the design blocks 102 and 104 together with functional models that emulate the behavior of the processor 108, the memory subsystems 110 and 118, and/or the peripherals 112, 114, and 126. Because emulation may require fewer simulation resources than a detailed simulation model, the design blocks 102 and 104 may be efficiently verified using a simulation environment 100 that emulates the behavior of certain other blocks.

In certain embodiments of the invention, a generic interface block 128 may be used to emulate one or more of the peripherals 112, 114, and 126. In addition, the generic interface block 128 may be used to emulate memory subsystem 118. The functional models for the peripherals 112, 114, and 126 may each be based on a single generic interface block 128, and the behavior of the generic interface block 128 may be customized to emulate the possibly different protocols of the input/output interfaces on lines 120, 122, and 124.

Figure 2:
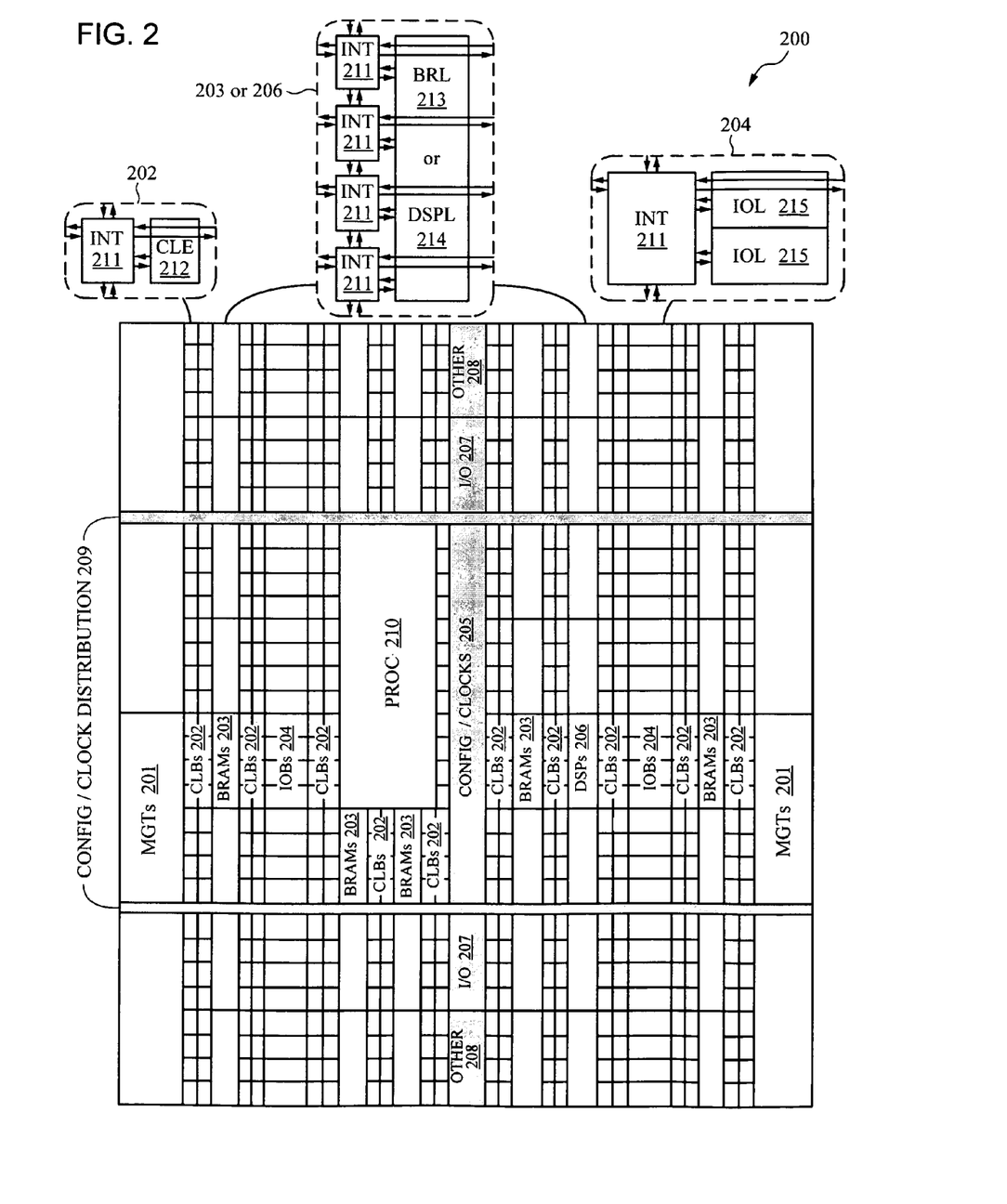
FIG. 2 is a block diagram of a programmable logic device (PLD) that may be used to implement a design block having a simulation environment in accordance with various embodiments of the invention.

FIG. 2 is a block diagram of a programmable logic device (PLD) that may be used to implement design blocks having a simulation environment in accordance with various embodiments of the invention. The simulation environment may include functions that are internal and external to the PLD, and the design blocks may be implemented in dedicated circuits and/or programmable logic and interconnect resources within the PLD.

Certain PLDs, such as an advanced field programmable gate array (FPGA), can include several different types of programmable logic blocks in an array of programmable tiles. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
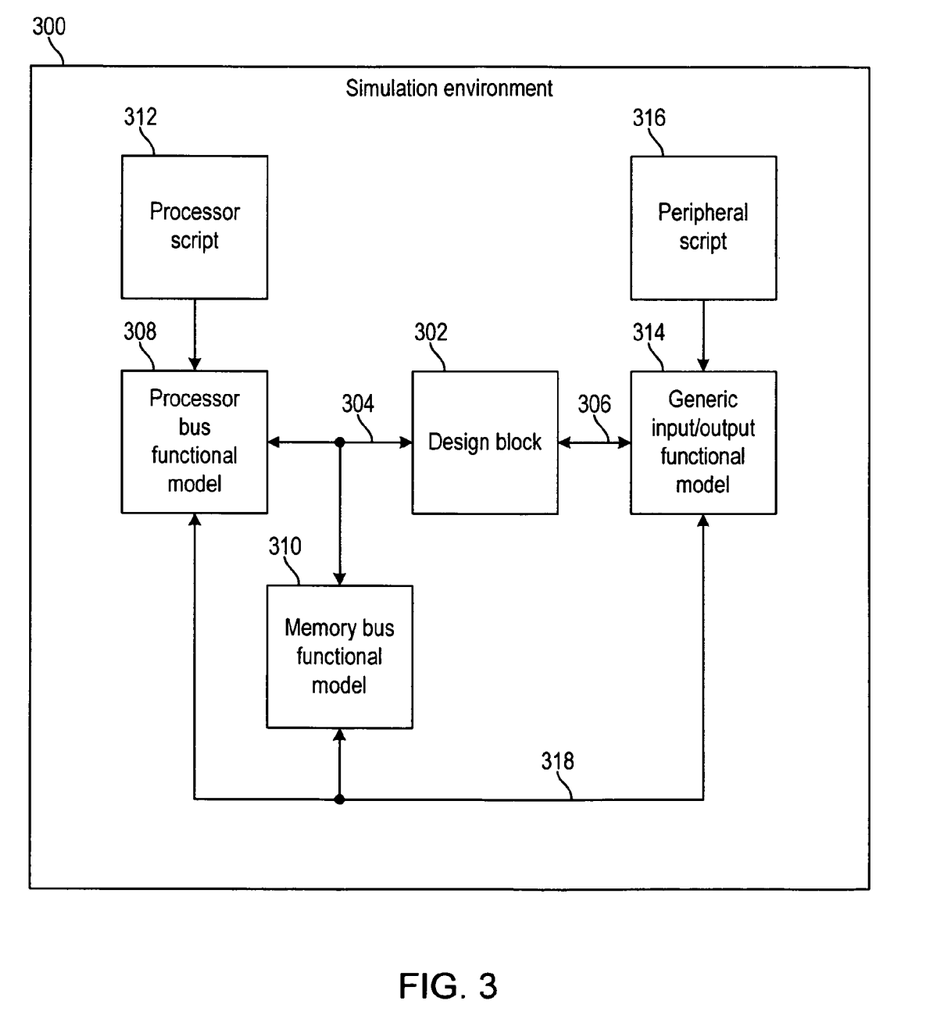
FIG. 3 is a block diagram of a simulation environment for a design block in accordance with various embodiments of the invention.

FIG. 3 is a block diagram of a simulation environment 300 for a design block 302 in accordance with various embodiments of the invention. The design block 302 may be a protocol converter between an interface on line 304 for a processor bus and an input/output interface on line 306.

A bus functional model 308 for a processor may emulate the interaction of the processor with the processor interface on line 304. The bus functional model 308 may transmit transactions to the processor interface on line 304 and receive transactions from the processor interface on line 304. The transactions may be transferred between the bus functional model 308 and the design block 302 and/or the bus functional model 310 for a memory subsystem. The transactions issued by the bus functional model 308 and/or certain transactions that are expected to be received by the bus functional model 308 may be specified by a processor script 312. The processor script 312 may specify a sequence of commands for the transactions in the order that the transactions are transmitted or expected to be received. The bus functional model 308 may execute or interpret the commands from the script 312 in the order of the sequence. The bus functional model 308 may output an error message to a user of the simulation environment 300 when an expected transaction is not actually received as specified.

Input/output functional model 314 may be a generic functional model that may emulate multiple input/output interfaces of various peripherals. A peripheral script 316 may control which particular input/output interface is emulated by the generic functional model 314. In one embodiment, an initialization command in the peripheral script 316 may specify the particular input/output interface. In another embodiment, the generic functional model 314 have a set of general purpose inputs and outputs and the peripheral script 316 may control each input and output according to a protocol for a corresponding signal of a specific input/output interface. The peripheral script 316 may also specify a sequence of issued and expected transactions in the order that the transactions are issued or expected to be received.

Memory functional model 310 may emulate a memory subsystem that responds to transactions from processor interface 304. For example, the transactions from the processor interface 304 may include a memory read to an address, or a memory write to an address with write data. For a memory read, the memory functional model 310 may respond on the processor interface 304 with data stored at the address in the memory. For a memory write with write data, the memory functional model 310 may store the write data at the address in the memory.

Because the memory functional model 310 responds to transactions and might not issue or check for expected transactions, the memory functional model 310 does not require a script specifying transactions transferred between the memory functional model 310 and the processor interface 304. It will be appreciated that the memory functional model 310 may have the capability of modeling various memory subsystems and a script or other configuration may select the particular memory subsystem that is modeled. For example, configuration tools for a PLD may permit the BRAM and distributed storage within the PLD to be configured as a memory subsystem by the specification of various parameters, such as the width of data and depth of address locations of the memory subsystem, and the specified values for the parameters may be used to specify corresponding behavior for a memory functional model 310.

The simulation environment 300 may couple a synchronization bus on line 318 to the functional models 308, 310, and 314. The synchronization bus on line 318 may be used to synchronize the transactions of the processor script and the peripheral script. Each script may include synchronization commands, with certain commands generating a synchronization signal on the synchronization bus on line 318, and other commands suspending the execution of the script until a synchronization signal is received on the synchronization bus on line 318.

Figure 4:
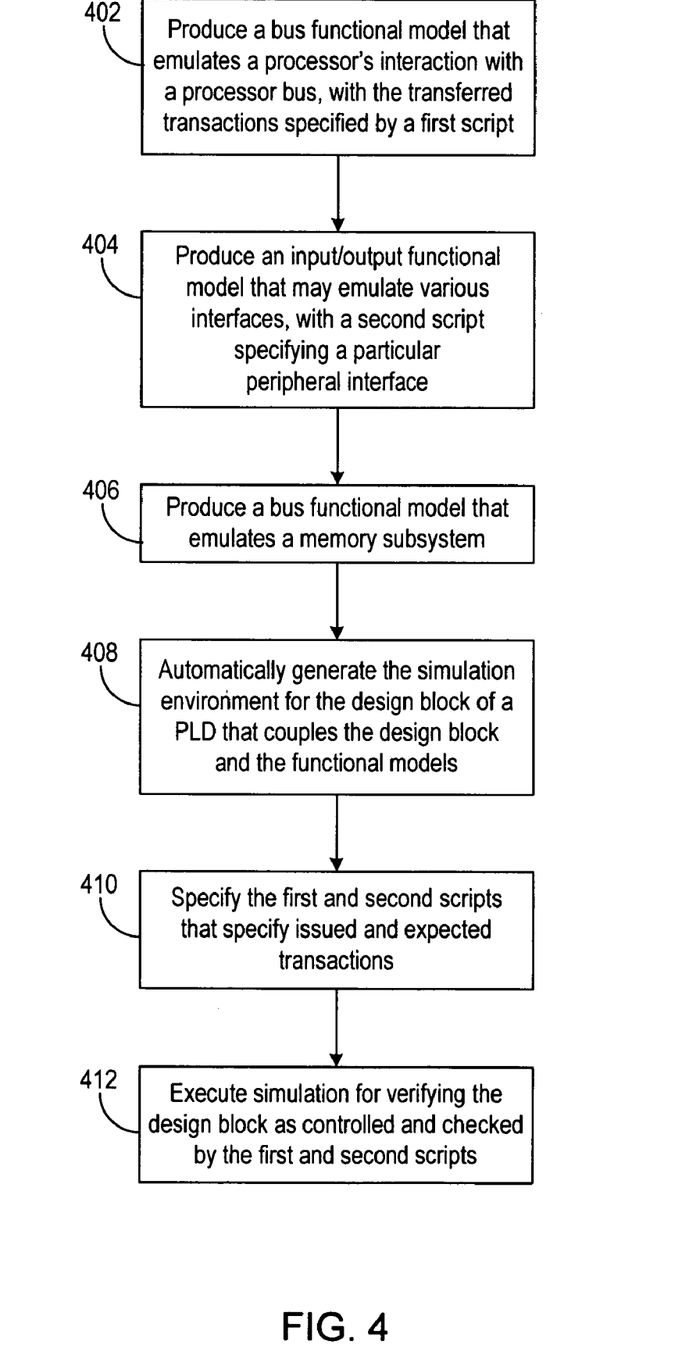
FIG. 4 is a flow diagram of a process for building a simulation environment for a design block in accordance with various embodiments of the invention.

FIG. 4 is a flow diagram of a process for building a simulation environment for a design block in accordance with various embodiments of the invention. The design block or multiple design blocks may be efficiently verified using the simulation environment. The design block may perform protocol conversion between a bus of a processor and an input/output interface of a peripheral.

At step 402, a bus functional model is produced that emulates the interaction between a processor and a bus for the processor. The bus may be coupled in the simulation environment to the bus functional model for the processor, the design block, and other functional models including a functional model for a memory subsystem. To improve the efficiency of the simulation environment, the processor's bus functional model may emulate the behavior of the processor instead of fully modeling the operation of the processor. The bus functional model may emulate the behavior of the processor by issuing transactions as specified by a controlling script. The script may include a command for each issued transaction and may also include a command for certain transactions that are expected to be received by the bus functional model. In addition, a protocol checker may verify compliance of the transactions on the bus with a protocol for the bus of the processor.

At step 404, a functional model is produced that emulates an input/output interface of a peripheral. The functional model may be capable of emulating multiple interfaces, and a script for the functional model specifies which input/output interface is emulated along with issued and expected transactions for the input/output interface.

At step 406, another bus functional model is produced that emulates a memory subsystem.

At step 408, a simulation environment is automatically generated for the design block of a PLD. The simulation environment may couple the processor bus to the design block and the functional models for the processor and the memory subsystem. The simulation environment may also couple the input/output interface to the design block and the functional model for the input/output interface. The simulation environment may include a specification in a hardware description language of the connections between the design block and the bus functional models.

At step 410, the scripts are specified that control the functional models for the processor and the input/output interface. Each script may include a sequence of commands with each command specifying a transaction issued by the associated functional model, a transaction expected to be received by the associated functional model, or synchronization of the transactions of functional models for the processor and the input/output interface.

At step 412, the simulation environment may be executed to simulate and verify the design block. A defect in the design block may be detected when an expected transaction is not received by the functional models for either the processor or the input/output interface. Certain unexpected transactions may optionally generate an error indicating a potential defect in the design block. The bus functional model for the memory subsystem may detect certain errors, such as a memory address that is out of range. The simulation environment may include a protocol checker that also may detect a defect in the design block when a protocol for the processor bus is violated.

Figure 5:
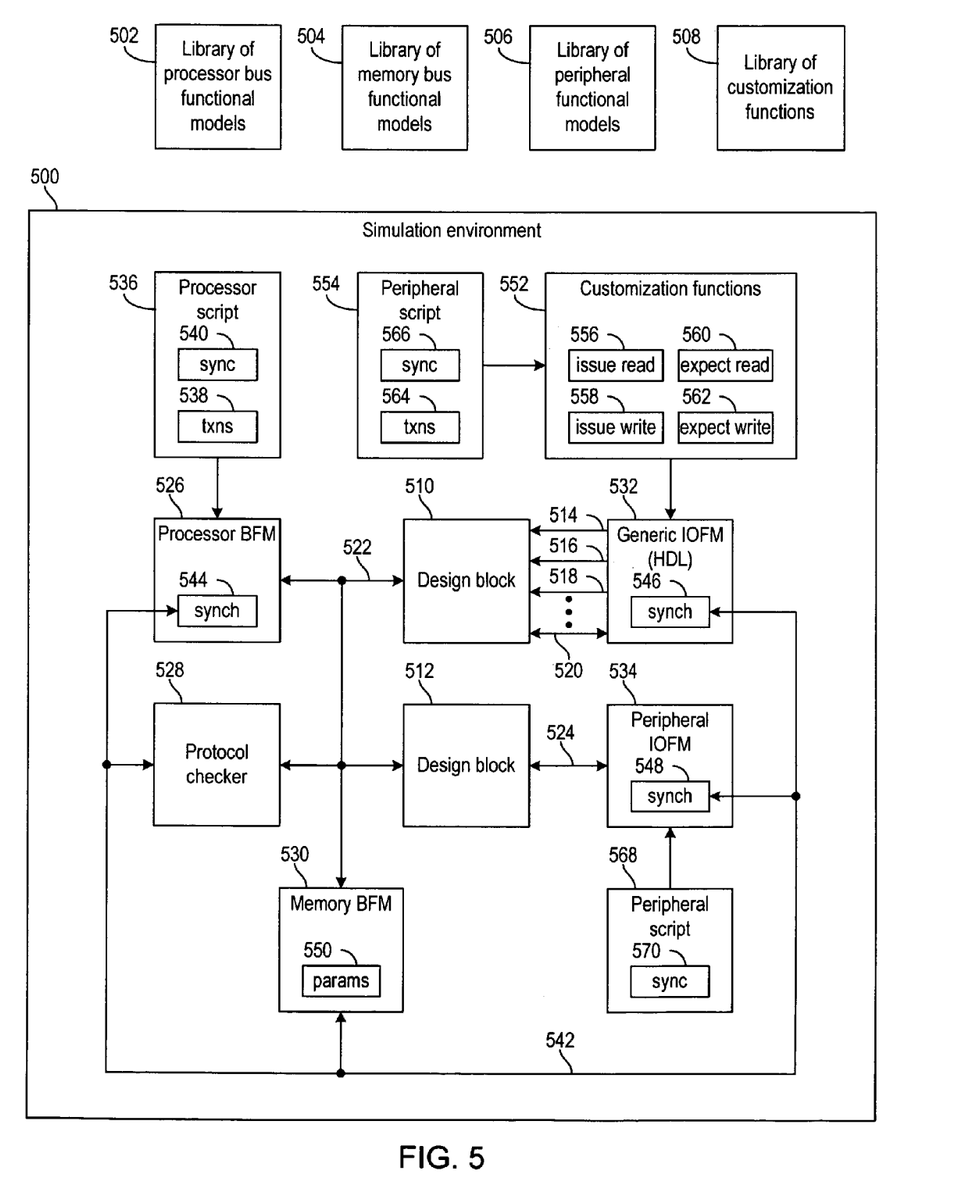
FIG. 5 is a block diagram of a simulation environment and associated libraries in accordance with various embodiments of the invention.

FIG. 5 is a block diagram of a simulation environment 500 and associated libraries 502, 504, 506, and 508 in accordance with various embodiments of the invention. The simulation environment 500 may be used to efficiently verify the design blocks 510 and 512. Design block 510 may bridge between a bus of a processor and an input/output interface on lines 514, 516, 518, and 520. Design block 512 may similarly bridge between the processor interface on line 522 and an input/output interface on line 524.

The simulation environment 500 may couple the processor interface on line 522 to a bus functional model 526 for a processor, the design blocks 510 and 512, a protocol checker 528, and a bus functional model 530 for a memory subsystem. The simulation environment 500 may couple the input/output interface on lines 514 through 520 to the design block 510 and a generic functional model 532 for peripheral input/output. Similarly, the simulation environment 500 may couple the input/output interface on line 524 to the design block 512 and the functional model 534 for peripheral input/output.

The library 502 may include a separate bus functional model for each type of processor included in dedicated circuitry of a PLD and for each type of processor that may be implemented in the programmable logic and interconnect resources of the PLD. Depending upon the type of processor for an electronic design, the corresponding bus functional model 526 for the processor type may be selected from the library 502. Library 502 may also include protocol checkers for the types of processors, and protocol checker 528 may be selected from the library 502 based on the type of the processor.

The bus functional model 526 may be controlled by a processor script 536 that specifies transaction commands 538 and synchronization commands 540. The transaction commands 538 may specify transactions that are issued by the bus functional model 526 to the processor interface on line 522 and transactions that are expected to be received by the bus functional model 526 from the processor interface on line 522. The synchronization commands 540 may specify transmission and reception of one or more synchronization signals of the synchronization bus on line 542 via the synchronizer 544 of the bus functional model 526.

Each of synchronization commands 540 may specify either transmission or reception of a synchronization signal of the synchronization bus on line 542. A synchronization command for transmitting a synchronization signal may specify outputting of the synchronization signal to the synchronization bus on line 542 from the synchronizer 544 of the bus functional model 526 for the processor. A synchronization command for reception of a synchronization signal may specify that the bus functional model 526 should wait for the synchronizer 544 to receive the synchronization signal from the synchronization bus on line 542. The received synchronization signal may be generated by the bus functional model 530 for memory or by the synchronizers 546 and 548 of the input/output functional models 532 and 534.

The library 504 of bus functional models for memory subsystems may provide various functional models for memory systems that may be internal and/or external to a PLD. Example memory subsystems include a memory subsystem using BRAM and/or distributed memory resources of a PLD, and external SDRAMs having a memory controller that is implemented in the programmable logic and interconnect resources of a PLD. The library 504 may include distinct functional models for various types of memory subsystems and bus functional model 530 may selected from library 504 based on the type of the memory subsystem. The selected bus functional model 530 may include parameters 550 that further customize the operation of the bus functional model.

The library 506 of input/output functional models may include dedicated functional models for certain input/output interfaces and a generic functional model that may be customized to implement a variety of input/output interfaces. Library 506 may include dedicated functional models for input/output interfaces that are frequently used. The input/output interface on line 524 may have a type for which the library 506 has a matching functional model 534. The input/output interface on lines 514 through 520 might not match the available types of dedicated functional models in library 506, and consequently the generic functional model 532 may selected from library 506 to emulate this input/output interface.

While the generic functional model 532 may be directly controlled by a script, the library 508 of customization functions 508 may provide sets of customization functions for various types of input/output interfaces. Each set of customization functions from the library 508 may assist the emulation by the generic functional model 532 of an input/output interface having the corresponding type. A particular set of customization functions 552 may be selected from library 508 based on a type of the input/output interface on lines 514 through 520.

The customization functions 552 may simplify the specification of the peripheral script 554 controlling the operation of the generic functional model 532. For example, the customization functions 552 may include a function for initializing the input/output interface that generates a pulse on the reset signal on line 514 and another function that enables the oscillation of a clock signal on line 516. The customization functions 552 may also include functions 556, 558, 560, and 562 for issuing transactions and expecting transactions at the input/output interface of lines 514 through 520. It will be appreciated that creating a set of customization functions for a new input/output interface may be less time-consuming and less expensive than creating a dedicated input/output functional model for the new input/output interface.

Customization function 556 may accept a high-level specification of a read transaction and provide the low-level control that causes generic functional model 532 to issue a read transaction on the input/output interface of lines 514 through 520. For example, the high-level specification may include the address and size of the read transaction and function 556 may issue the read transaction by controlling individual outputs of the generic functional model 532 over a series of cycles of the clock signal on line 516. The low-level control may include monitoring of certain signals on line 520 of the input/output interface, such as monitoring a signal indicating acceptance of the read transaction by the design block 510. Customization function 558 may similarly cause the generic functional model 532 to issue a write transaction on the input/output interface on lines 514 through 520. Customization functions 552 may also include a customization function that causes the generic functional model 532 to issue an interrupt signal on line 518.

In one embodiment, the customization function 560 may accept a high-level specification of a read transaction that is expected to be received by the generic functional model 532 at the input/output interface of lines 514 through 520. Customization function 560 may collect information from certain signals of line 520 of the input/output interface and form a received transaction from the collected information. The customization function 560 may compare the received transaction with the specification of the expected read transaction. The customization function 562 may similarly compare a received transaction with an expected write transaction. In another embodiment, customization functions 552 may include a customization function that collects a high-level specification of each transaction that is received from the input/output interface on lines 514 through 520, and peripheral script 554 may check whether or not the received transaction is an expected transaction. A user of the simulation environment 500 may be notified when an unexpected transaction is received or when an expected transaction is not received.

The peripheral script 554 may include a sequence of commands including transaction commands 564 and synchronization commands 566. Each of transaction commands 564 may use one of customization functions 552 for transfer of a corresponding transaction between the generic functional model 532 and the input/output interface on lines 514 through 520. The synchronization commands 556 of peripheral script 554 may be used in cooperation with the synchronization commands 540 of the processor script 536 to synchronize between the transaction commands 564 and 538 of the scripts 554 and 536. In one embodiment, only one of scripts 536, 554, and 568 is active during simulation of the design blocks 510 and 512 in the simulation environment 500, and the synchronization commands 540, 566, and 570 are used change the script that is currently active.

In one embodiment, the generic functional model 532 is specified in a hardware description language, such as Verilog or VHDL, of the simulation environment 500, and the scripts 536, 554, and 568 are specified in the tool command language (Tcl). The scripts 536, 554, and 568 may be compiled into command files for the ModelSim or NCSim simulation engine for the simulation environment 500. The customization functions 552 may also be specified in Tcl.

Figure 6:
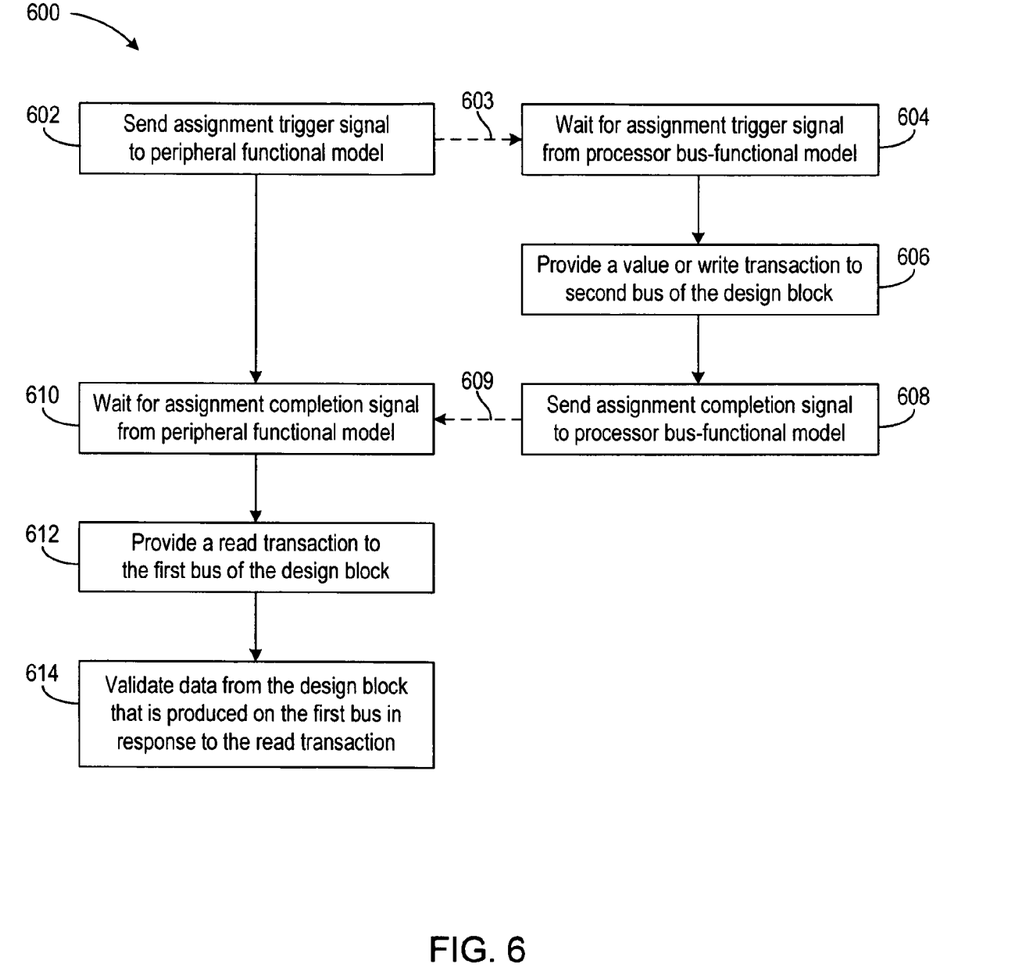
FIG. 6 is a flow diagram of a synchronized parallel process for an example of simulating a design block in accordance with various embodiments of the invention.

FIG. 6 is a flow diagram of a synchronized parallel process 600 for an example of simulating a design block in accordance with various embodiments of the invention. A bus functional model for a processor may have a processor script containing a sequence of respective commands for the steps 602, 610, 612, and 614, and a functional model for an input/output interface of a peripheral may have a corresponding peripheral script containing a sequence of respective commands for the steps 604, 606, and 608.

At step 602, an assignment trigger command in the processor script directs the bus functional model of the processor to send an assignment trigger signal 603 via the synchronization bus to the functional model for the input/output interface. At step 610, a wait command directs the bus functional model to wait until an assignment completion signal 609 is received via the synchronization bus.

At step 604, a wait command of the peripheral script directs the functional model for the input/output interface to wait until the assignment trigger signal 603 is received. When the assignment trigger signal 603 generated at step 602 is received by the functional model for the input/output interface at step 604, process 600 proceeds to step 606. At step 606, a write or other command directs the functional model for the input/output interface to issue a write transaction or otherwise issue a value to the design block on the input/output interface. At step 608, an assignment completion command directs the functional model for the input/output interface to send an assignment completion signal 609 to the bus functional model for the processor.

When the assignment completion signal 609 generated at step 608 is received by the bus functional model for the processor at step 610, process 600 proceeds to step 612. At step 612, a read command directs the bus functional model for the processor to issue a read transaction to the design block on the processor bus, and the read command may also specify the expected data to be returned by the design block. At step 614, the actual data returned by the design block may be compared with the assertion of the expected data. If the actual data does not match the expected data, or the design block does not respond to the read transaction, the bus functional model may issue a notification message for the violation.

The generation and waiting for synchronization signals may simplify the development of a test of the design block because parallel activity by the two functional models can be eliminated through proper usage of the synchronization commands and corresponding synchronization signals. In certain scenarios, parallel activity may lead to indeterminate behavior. For example, without the synchronization signal 609 a read at step 612 may occur either before or after a write at step 606, and the ordering of the read at step 612 and the write at step 606 may vary between multiple executions of the same scripts depending on the scheduling of activity within the simulation environment. The synchronization commands may be used to eliminate such indeterminate behavior. In addition, the synchronization commands are often used to simplify the control flow of the parallel execution of the scripts. The scripts can be written such that a single control flow is specified by generally having one script waiting for a synchronization signal while the other script is actively being processed. Because one or more synchronization signals may be sent and received at a particular simulation time, transactions may be issued on both the processor bus and the input/output interface at the same simulation time even though only one script at a time is actively being processed.

Figure 7:
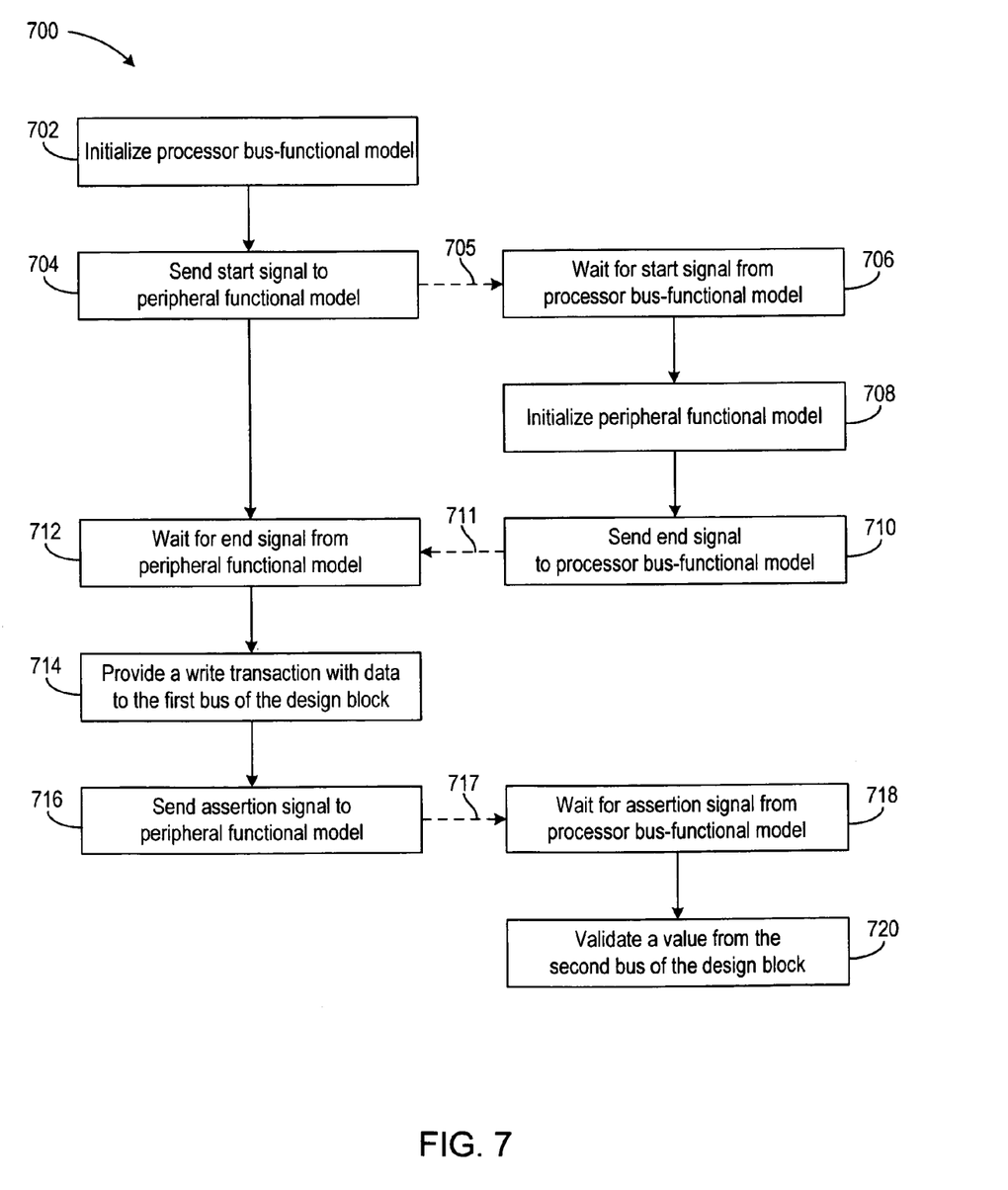
FIG. 7 is a flow diagram of synchronized parallel process for another example of simulating a design block in accordance with various embodiments of the invention.

FIG. 7 is a flow diagram of synchronized parallel process 700 for another example of simulating a design block in accordance with various embodiments of the invention. A bus functional model for a processor may have a processor script containing a sequence of respective commands for the steps 702, 704, 712, 714, and 716, and a functional model for an input/output interface of a peripheral may have a corresponding peripheral script containing a sequence of respective commands for the steps 706, 708, 710, 718, and 720.

At step 702, the processor script for the bus functional model may include commands to initialize the bus functional model. At step 704, a start command in the processor script directs the bus functional model for the processor to send a start signal 705 via the synchronization bus to the functional model for the input/output interface. At step 712, a wait command directs the bus functional model to wait until an end signal 711 is received via the synchronization bus.

At step 706, a wait command of the peripheral script directs the functional model for the input/output interface to wait until the start signal 705 is received. When the start signal 705 generated at step 704 is received at step 706, process 700 proceeds to step 708. The initialization at step 708 may require that the initialization at step 702 is previously completed, and the sending and receiving of the start signal 705 at steps 704 and 706 may ensure that step 702 is completed before step 708 is begun. At step 710, an end command directs the functional model for the input/output interface to send an end signal 711 to the bus functional model for the processor.

When the end signal 711 generated at step 710 is received at step 712, process 700 proceeds to step 714. The initialization of both functional models for the processor and the input/output interface may need to be completed before issuing transactions that test the design block, and the sending and receiving of the end signal 711 at steps 710 and 712 may ensure that initialization is complete before beginning step 714. At step 714, a write command directs the bus functional model for the processor to issue a write transaction with data on the processor bus. At step 716, an assertion command in the processor script directs the bus functional model for the processor to send an assertion signal 717 to the functional model for the input/output interface.

At step 718, a wait command of the peripheral script directs the functional model for the input/output interface to wait until the assertion signal 717 is received. When the assertion signal 717 generated at step 716 is received at step 718, process 700 proceeds to step 720. At step 720, a value on the input/output interface from the design block is validated. The value may be issued by the design block in response to the write transaction of step 714, or a read command of the peripheral script may read a value that is stored in the design block due to the write transaction of step 714.

Figure 8:
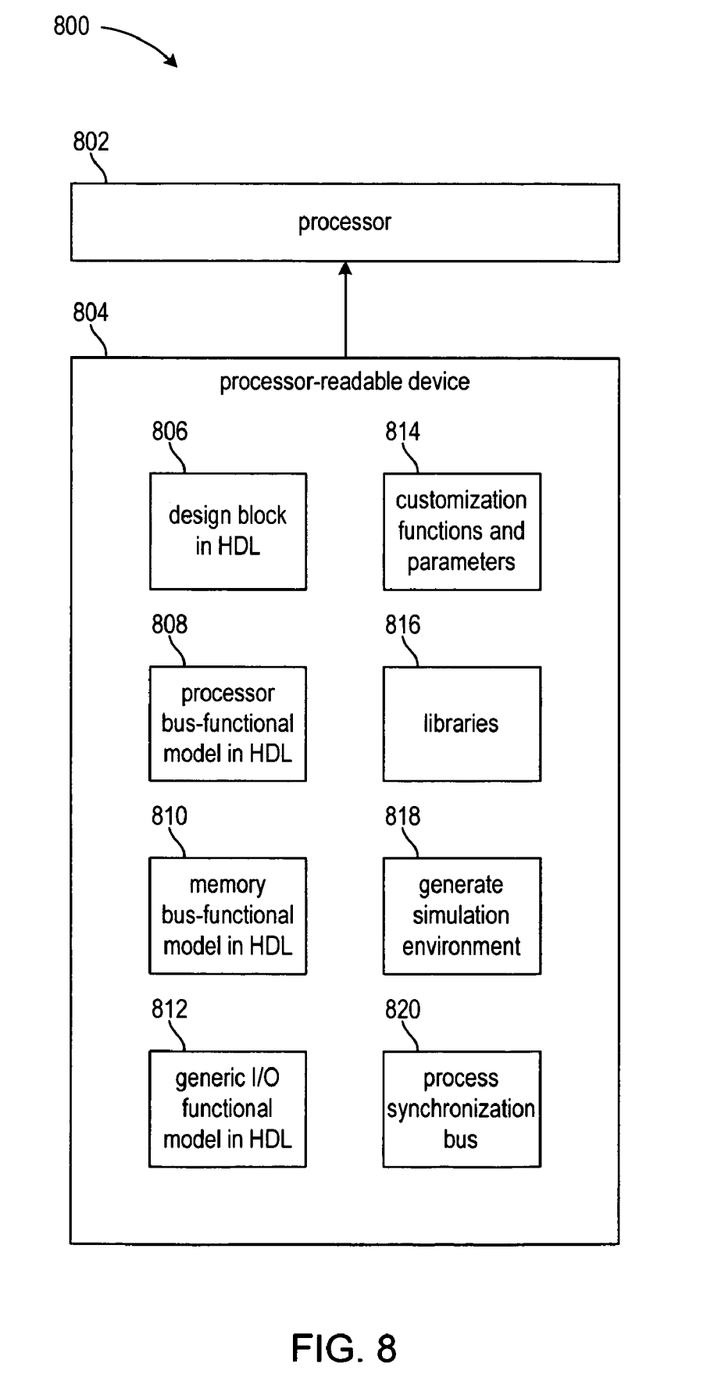
FIG. 8 is a block diagram of a system that constructs a simulation environment for a design block in accordance with various embodiments of the invention.

FIG. 8 is a block diagram of a system 800 that constructs a simulation environment for a design block in accordance with various embodiments of the invention. The system 800 includes a processor 802 that may access instructions and data in processor-readable device 804. The processor-readable device 804 may include data modules 806, 808, 810, 812, 814, and 816, and software modules 818, and 820.

A hardware description language (HDL) specification of one or more design blocks may be included in data module 806. Similarly, data module 808 may include an HDL specification of a bus functional model for a processor, data module 810 may include an HDL specification of a bus functional model for a memory subsystem, and data module 812 may include an HDL specification of a generic functional model. The customization functions and parameters from data module 814 may specify operating parameters for the bus functional models for the processor and the memory subsystem. The customization functions and parameters from data module 814 may also determine a specific input/output interface that is implemented by the generic functional model. Libraries 816 may provide various functional models and customization functions and parameters.

Software module 818 may include instruction that are executed by processor 802 and cause processor 802 to generate a simulation environment. During simulation of a design block from module 806, processor 802 may process the synchronization bus of the simulation environment using the instructions from software module 820.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for simulating electronic circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of building a simulation environment that includes a design block for a programmable logic device (PLD), comprising:

producing a first functional model that emulates interaction of a processor with a first interface of a bus for the processor, the first functional model controlled by a first script in a scripting language, the first script specifying a first plurality of transactions transferred between the first functional model and the first interface;

producing a second functional model controllable to emulate a plurality of interfaces, the second functional model controlled to emulate a second interface of an input/output peripheral by a second script in the scripting language, the second script specifying a second plurality of transactions transferred between the second functional model and the second interface;

producing a third functional model that emulates a memory subsystem, the third functional model responsive to a plurality of transactions of the bus for the processor; and automatically generating the simulation environment that simulates the design block for the PLD, wherein the simulation environment couples the bus for the processor to the design block and the first and third functional models, couples the second interface to the design block and the second functional model, and couples the first and second functional models via a synchronization bus used for synchronizing between the first plurality of transactions of the first script and the second plurality of transactions of the second script.

2. The method of claim 1, wherein the producing a first functional model includes selecting a protocol checker that checks for compliance of the bus for the processor with a protocol for the bus.

3. The method of claim 1, wherein the producing a first functional model includes selecting the first functional model from a library of functional models in response to a type of the processor, the producing a second functional model includes selecting the second functional model from a library of functional models in response to a type of the second interface, and the producing a third functional model includes selecting the third functional model from a library of functional models in response to a type of the memory subsystem.

4. The method of claim 1, wherein the second functional model includes a generic interface block controllable to emulate the plurality of interfaces and the producing a second functional model includes selecting a set of customization functions corresponding to a type of the second interface.

5. The method of claim 4, further comprising specifying the generic interface block in a hardware description language of the simulation environment.

6. The method of claim 4, wherein the second script uses the set of customization functions for the specifying of the second plurality of transactions transferred between the second functional model and the second interface, each of the second plurality of transactions having a corresponding customization function in the set.

7. The method of claim 6, wherein the second plurality of transactions include a read transaction and a write transaction of the second interface and the set includes corresponding customization functions for four combinations of the generic interface block issuing and receiving the read and write transactions at the second interface.

8. The method of claim 7, wherein the generic interface block emulates a plurality of signals of the second interface and at least one customization function in the set specifies respective values for a subset of the signals for at least one time period of the simulation environment.

9. The method of claim 8, wherein the plurality of signals of the second interface include a reset signal, a clock signal, and an interrupt signal.

10. The method of claim 1, wherein the producing a third functional model includes generating a set of customization parameters for a memory functional model in response to a specification of the memory subsystem.

11. The method of claim 1, wherein the processor is one of a dedicated processor of the PLD and a processor implemented in programmable logic and interconnect resources of the PLD.

12. The method of claim 1, wherein the third functional model emulates the memory subsystem that is internal to the PLD.

13. The method of claim 1, wherein the first and second scripts each include at least one synchronization command for synchronizing between the first plurality of transactions of the first script and the second plurality of transactions of the second script, the synchronization commands of the first and second scripts including a synchronization command that specifies issuance of a synchronization signal on the synchronization bus and another synchronization command that specifies waiting for receipt of a synchronization signal on the synchronization bus.

14. The method of claim 1, further comprising, for each of at least one additional design block, producing a respective fourth functional model controllable to emulate a plurality of interfaces, the respective fourth functional model controlled to emulate a third interface corresponding to the additional design block by a third script in the scripting language, the third script specifying a third plurality of transactions transferred between the respective fourth functional model and the third interface, wherein the automatically generating of the simulation environment includes automatically generating the simulation environment that, for each additional design block, couples the bus for the processor to the additional design block, couples the third interface to the additional design block and the respective fourth functional model, and couples the respective fourth functional model to the synchronization bus.

15. The method of claim 14, wherein each of the first, second, and third scripts includes at least one synchronization command, the synchronization commands of the scripts including a synchronization command that specifies issuance of a synchronization signal on the synchronization bus and another synchronization command that specifies waiting for receipt of a synchronization signal on the synchronization bus.

16. The method of claim 1, wherein the first script specifies the first plurality of transactions that are issued to the first interface by the first functional model and expected from the first interface by the first functional model.

17. The method of claim 1, wherein the second script specifies the second plurality of transactions that are issued to the second interface by the second functional model and expected from the second interface by the second functional model.

18. A program storage medium, comprising:
a processor-readable device configured with instructions for building a simulation environment that includes a design block for a programmable logic device (PLD), wherein execution of the instructions by one or more processors causes the one or more processors to perform operations including,
producing a first functional model that emulates interaction of a processor with a first interface of a bus for the processor, the first functional model controlled by a first script in a scripting language, the first script specifying a first plurality of transactions transferred between the first functional model and the first interface;
producing a second functional model controllable to emulate a plurality of interfaces, the second functional model controlled to emulate a second interface of an input/output peripheral by a second script in the scripting language, the second script specifying a second plurality of transactions transferred between the second functional model and the second interface;
producing a third functional model that emulates a memory subsystem, the third functional model responsive to a plurality of transactions of the bus for the processor; and
automatically generating the simulation environment that simulates the design block for the PLD, wherein the simulation environment couples the bus for the processor to the design block and the first and third functional models, couples the second interface to the design block and the second functional model, and couples the first and second functional models via a synchronization bus used for synchronizing between the first plurality of transactions of the first script and the second plurality of transactions of the second script.

19. The program storage medium of claim 18, wherein the first script specifies the first plurality of transactions that are issued to the first interface by the first functional model and that are expected from the first interface by the first functional model, the second script specifies the second plurality of transactions that are issued to the second interface by the second functional model and that are expected from the second interface by the second functional model, and the first and second scripts each include at least one synchronization command, the synchronization commands of the scripts including a synchronization command that specifies issuance of a synchronization signal on the synchronization bus and another synchronization command that specifies waiting for receipt of the synchronization signal on the synchronization bus.

20. A system for building a simulation environment that includes a design block for a programmable logic device (PLD), comprising:
means for producing a first functional model that emulates interaction of a processor with a first interface of a bus for the processor, the first functional model controlled by a first script in a scripting language, the first script specifying a first plurality of transactions transferred between the first functional model and the first interface;

means for producing a second functional model controllable to emulate a plurality of interfaces, the second functional model controlled to emulate a second interface of an input/output peripheral by a second script in the scripting language, the second script specifying a second plurality of transactions transferred between the second functional model and the second interface;

means for producing a third functional model that emulates a memory subsystem, the third functional model responsive to a plurality of transactions of the bus for the processor; and means for automatically generating the simulation environment that simulates the design block for the PLD, wherein the simulation environment couples the bus for the processor to the design block and the first and third functional models, couples the second interface to the design block and the second functional model, and couples the first and second functional models via a synchronization bus used for synchronizing between the first plurality of transactions of the first script and the second plurality of transactions of the second script.

* * * * *